United States Patent [19]

Miller et al.

[11] 4,024,560
[45] May 17, 1977

[54] PYROELECTRIC-FIELD EFFECT ELECTROMAGNETIC RADIATION DETECTOR

[75] Inventors: Robert C. Miller; Shu-Yau Wu, both of Pittsburgh; George W. Roland, Monroeville, all of Pa.

[73] Assignee: Westinghouse Electric Corporation, Pittsburgh, Pa.

[22] Filed: Sept. 4, 1975

[21] Appl. No.: 610,365

[52] U.S. Cl. .................................. 357/23; 357/28; 357/30; 250/338; 250/340
[51] Int. Cl.² .................. H01L 29/78; H01L 23/56
[58] Field of Search .................. 357/23, 28, 30; 250/338, 340

[56] References Cited

UNITED STATES PATENTS

| | | | |
|---|---|---|---|
| 3,400,383 | 9/1968 | Meadows | 340/173 |
| 3,426,255 | 2/1969 | Heywang | 317/235 |
| 3,450,966 | 6/1969 | Perlman | 317/235 |
| 3,453,887 | 7/1969 | Wooten | 73/362 |

OTHER PUBLICATIONS

Simhong et al., *Journ. Appl. Phys.*, vol. 42, No. 10, Sept. 1971, pp. 3741–3744.

Kittel, *Introduction to Solid State Physics*, 4th Ed., J. Wiley & Son, N.Y., p. 476.

*Primary Examiner*—Martin H. Edlow
*Attorney, Agent, or Firm*—C. L. Menzemer

[57] ABSTRACT

A pyroelectric-field effect electromagnetic radiation detector is comprised of a semiconductor body having opposed major surfaces. First and second electrodes are spaced apart from each other in ohmic contact with said semiconductor body to form a conductive channel in said body between said electrodes. A pyroelectric body having opposed major surfaces substantially normal to a polar axis thereof is positioned with one said major surface in intimate contact with and preferably electrostatically bonded to a major surface of said semiconductor body at least between said electrodes, and polarized therethrough substantially normal to said opposed major surfaces at least between said first and second electrodes. A gate electrode capable of absorbing radiation to be detected is also positioned adjacent said pyroelectric body at least between said electrodes. Alternatively, the semiconductor and pyroelectric bodies may be provided by a single body having both pyroelectric and semiconductor properties.

12 Claims, 7 Drawing Figures

PYROELECTRIC-FIELD EFFECT ELECTROMAGNETIC RADIATION DETECTOR

FIELD OF THE INVENTION

The present invention relates to electromagnetic radiation detectors and particularly pyroelectric electromagnetic radiation detectors.

BACKGROUND OF THE INVENTION

The pyroelectric effect has been widely used for the detection of electromagnetic radiation, see e.g. J. App. Phys. 42, 3741 (1971). Absorbed radiation causes a small temperature rise $\Delta I$ of a pyroelectric crystal. The rise in temperature changes the spontaneous polarization $P_S$ of the crystal and causes a charge to flow through an external load circuit connected across the crystal. The operating temperature of the detector is sufficiently removed from the Curie point of the crystal so that the pyroelectric coefficient $\lambda$, as well as the dielectric constant $\epsilon$ and the specific heat $c_p$ of the pyroelectric crystal can be considered constant for small $\Delta T$. The electromagnetic radiation is thus determined by measuring the pyroelectric voltage transients in the external circuit.

Specifically, in infrared detection, the detector generally comprises a thin slice of triglycine sulphate (TGS) or strontium-barium niobate (SBN) cleaved or cut from a single crystal normal to the pyroelectric axis. The crystal slice is polished to a thickness generally of 10 to 40 microns, and radiation-absorbing electrodes (area 0.2-3 mm$^2$) preferably of gold having exposed surfaces blackened are found on the major surfaces of the slice. Metal loeads are attached to electrode, e.g. by conducting epoxy, and the processed slice mounted in a hermetically sealed package having radiation transparent windows. The crystal slice is then poled with a steady field, e.g. 10$^4$ V/cm, to form single-domain material with a polarization field across the slice.

A typical measuring circuit is shown in FIG. 1 of the drawing hereto. A variable load resistor (10$^6$ – 10$^{12}$ ohms) is connected in parallel with the pyroelectric crystal, and a field-effect transistor source-follower circuit is connected as shown in FIG. 1. The pyroelectric voltage transients are measured on an oscilloscope (CRO) with a standard (e.g. 3A9) amplifier. Such detectors have been able to provide as low as 0.01 to 0.1° K sensitivity.

The main difficulty with such pyroelectric radiation detectors has been the bulk and expense of the detector as well as the accompanying measuring circuit. Also, the detector has been generally subject to high noise levels. The present invention overcomes these difficulties, and provides a pyroelectric electromagnetic radiation detector which can be fabricated and operated compatibly with large scale integrated circuits. Further, the pyroelectric detector of the present invention is considerably less noisy than previous pyroelectric radiation detectors.

SUMMARY OF THE INVENTION

A pyroelectric-field effect electromagnetic radiation detector is provided with a semiconductor body of a given conductivity type having opposed major surfaces. First and second electrodes are spaced apart from each other in ohmic contact with said semiconductor body and typically a single major surface thereof to form a conductive channel in said body between said electrodes. Said conductive channel is typically also defined by the thickness of the semiconductor body or by providing first and second impurity regions of opposite type conductivity from the body in said body adjoining the first and second electrodes, respectively. The conductivity of said channel can be thereby efficiently modulated by changes in polarization of the pyroelectric hereafter described.

A pyroelectric body having opposed major surfaces is prepared with a polar axis thereof substantially normal to said mjaor surfaces. The pyroelectric body is positioned in intimate contact with a major surface of said semiconductor body at least between said first and second electrodes preferably by electrostatically bonding a major surface of the pyroelectric body to the semiconductor body, or by vapor or sputter deposition of the semiconductor body onto the pyroelectric body. The pyroelectric body is spontaneously polarized or subsequently polarized with an external field therethrough substantially normal to said opposed major surfaces at least between said first and second electrodes.

A gate electrode capable of absorbing radiation to be detected, typically by blackening exposed surface portions thereof, is positioned adjacent a major surface of the pyroelectric body at least between said first and second electrodes. Typically, the gate is in intimate contact with the major surface of the pyroelectric body opposed to the major surface thereof where the semiconductor body is positioned. Alternatively, the gate electrode may, however, be spaced from the pyroelectric body by an electrical insulator layer or the like.

The detector preferably also includes a poling electrode adapted to polarize said pyroelectric body at least between said first and second electrodes and in turn effect the conductivity of said conductive channel. The poling electrode is typically applied to the major surface of the pyroelectric body opposite from the major surface thereof where the semiconductor body is positioned. In some embodiments, the poling electrode may be said first or second electrode, or both, where said first and/or second electrode is additionally in intimate contact with said pyroelectric body. In any event, polarization of the pyroelectric body is accomplished by application of a given external voltage between said gate electrode and said poling electrode.

In certain embodiments, the need for separate pyroelectric and semiconductor bodies can be eliminated by providing a single body having both pyroelectric and semiconductor properties. The pyroelectric-semiconductor body is typically supported on an insulator substrate, and the gate electrode is typically spaced from the body with an intermediate insulator layer in intimate contact with both said body and said gate electrode.

Other details, objects and advantages of the invention will become apparent as the following description of the presently preferred embodiments and presently preferred methods of practicing the same proceeds.

BRIEF DESCRIPTION OF THE DRAWINGS

In the accompanying drawings, the presently preferred embodiments of the invention and the presently preferred methods of practicing the invention are illustrated, in which.

DESCRIPTION OF THE PREFERRED EMBODIMENTS

Figure 1:
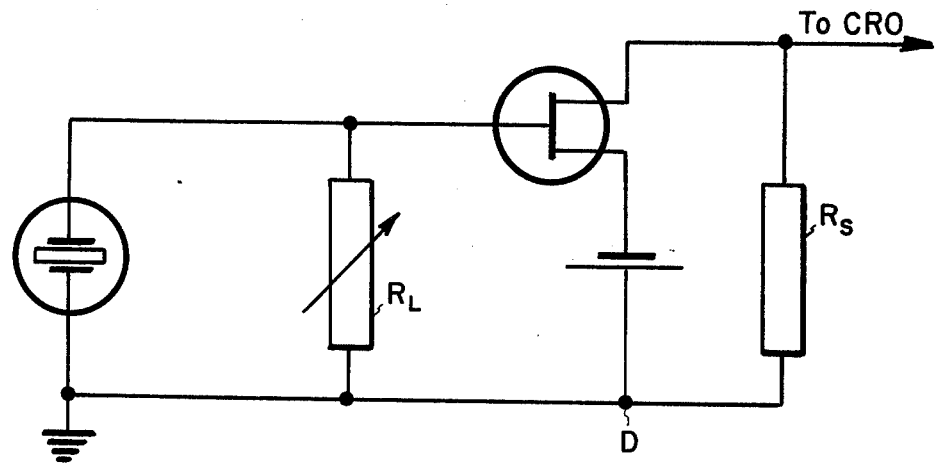
FIG. 1 is a schematic view of a pyroelectric electromagnetic radiation detector of the prior art.

Referring to FIG. 1, a prior art pyroelectric electromagnetic radiation detector is shown for purposes of comparison. Description of this prior detector can be found in the "Background of the Invention."

Figure 2:
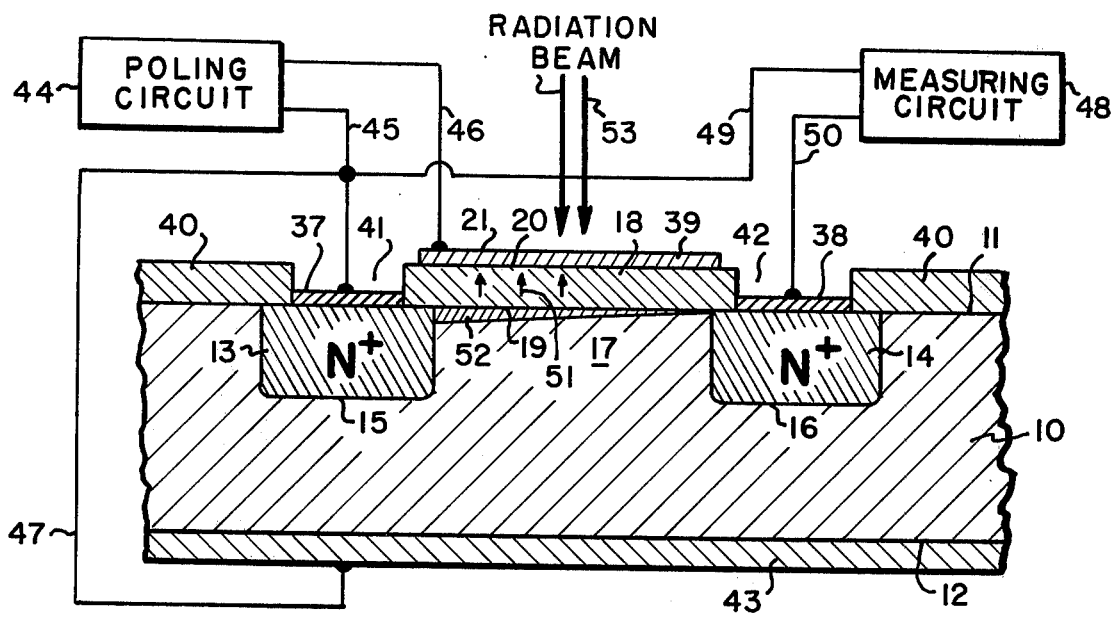
FIG. 2 is an elevational view in cross-section of a pyroelectric-field effect electromagnetic radiation detector, with the supporting circuits shown schematically.

Referring to FIG. 2, a pyroelectric-field effect electromagnetic radiation detector of the present invention is made by first forming a semiconductor body 10 having opposed first and second major surfaces 11 and 12 of a given conductivity, i.e. N or P type conductivity. The impurity concentration of semiconductor body 10 will, of course, vary with the particular electrical characteristics and sensitivity of the desired detector; however, generally the resistivity (N or P type) is preferably between about 1 and 100 ohm-cm.

Semiconductor body 10 is preferably a bulk material made by any conventional available method, although the body may be an epitaxially grown layer on a degenerate semiconductor, or insulator substrate such as sapphire or spinal. Typically, semiconductor body 10 is a silicon wafer made by the Czochralski or the float-zone technique. Alternatively, semiconductor body 10 may be a single crystal germanium or gallium arsenide. Also, although not desired for the described detector, semiconductor body 10 may be a single crystal, polycrystalline or amorphous material of any other suitable Group IV, III–V or II–VII semiconductor material, where crystalline, the semiconductor body may be prepared with major surfaces 11 and 12 in any convenient crystallographic orientation. Semiconductor body 10 is typically in a circular shape and has a substantially uniform thickness typically between about 100 and 500 microns.

Fabrication of the detector proceeds by diffusion of first and second impurity regions 13 and 14 into semiconductor body 10 through spaced apart portions of first major surface 11 to form conductive channel 17 in body 10 between regions 13 and 14. Impurity regions 13 and 14 are of opposite type conductivity from the given conductivity of the semiconductor body to form PN junctions 15 and 16, respectively in semiconductor body 10. Preferably impurity regions 13 and 14 are formed by standard open or closed tube diffusion techniques by selective diffusion through window patterns in a diffusion mask. If silicon is the semiconductor, the diffusion is typically performed by an open tube diffusion through window patterns, formed by standard photolithographic and etch techniques, in a silicon dioxide masking layer. The impurity is preferably introduced as a gas such as arsine ($AsH_3$), phosphine ($PH_3$) or diborane ($B_2H_6$) in a suitable carrier gas. Impurity regions 13 and 14 are preferably diffused with a surface impurity concentration between about $1 \times 10^{19}$ and $1 \times 10^{21}$ atoms/cm$^3$, and a depth of about 1 to 3 microns. After diffusion is completed, the diffusion mask layer is removed for subsequent processing.

Semiconductor body 10 is then prepared for positioning of pyroelectric body 18 in intimate contact with first major surface 11 of semiconductor body 10 between first and second impurity regions 13 and 14, preferably by electrostatically bonding as hereinafter described. Semiconductor body 10 is prepared by carefully lapping, polishing and cleaning first major surface 11, possibly with major surface 11 in a predescribed crystallographic orientation. Particularly for electrostatically bonding, first major surface 11 is preferably prepared in a flat, planar configuration. Such lapping, polishing and cleaning procedures are standard techniques, and are believed important to provide good, intimate contact between the pyroelectric body and the semiconductor body.

Preferably, pyroelectric body 18 is separately prepared by standard techniques. Suitable pyroelectric materials are tri-glycine sulfate [$(NH_2CH_2COOH)_3 \cdot H_2SO_4$], lithium tantalate ($LiTaO_3$), lithium niobate ($LiNbO_3$), lead titanate ($PbTiO_3$), lithium sulfate ($Li_2SO_4$, $H_2O$), SBN ($Sr_{1-x}Ba_xNb_2O_6$, where $0.25 \leq \chi \leq 0.75$), pyragyrite ($Ab_3SbS_3$), TAS ($Tl_3AsSe_3$), proustite ($Ag_3AsS_3$), barium titanate ($BaTiO_3$), potassium dihydrogen phosphate ($KH_2PO_4$), potassium di-dueterium phosphate ($KD_2PO_4$), potassium dihydrogen arsenate ($KH_2AsO_4$), potassium niobate ($KNbO_3$), and potassium tantalate ($KTaO_3$).

A prepared pyroelectric crystal is cleaved and/or cut to form pyroelectric body 18 with first and second opposed major surfaces 19 and 20 substantially normal to a polar axis of the crystal. Pyroelectric body 18 is typically substantially of uniform thickness of between 10 and 100 microns. Alternatively, pyroelectric body 18 may be prepared considerably thicker, e.g. 200 microns in thickness, particularly for electrostatic bonding is herein described, and subsequently thinned after the electrostatic bonding is completed to the described thickness. The pyroelectric body 18 is prepared for bonding by standard lapping, polishing and cleaning techniques.

For electrostatic bonding, pyroelectric body 18 is also preferably prepared by applying a metal layer 21 to second major surface 20. Metal layer 21 is a metal such as gold, deposited preferably by one of the standard vapor or sputter deposition techniques typically over the entire second major surface 20 to a thickness between about 5,000 and 50,000 Angstroms. Metal layer 21 provides a uniform field distribution across the pyroelectric body during the electrostatic bonding step as hereinafter described.

Figure 7:
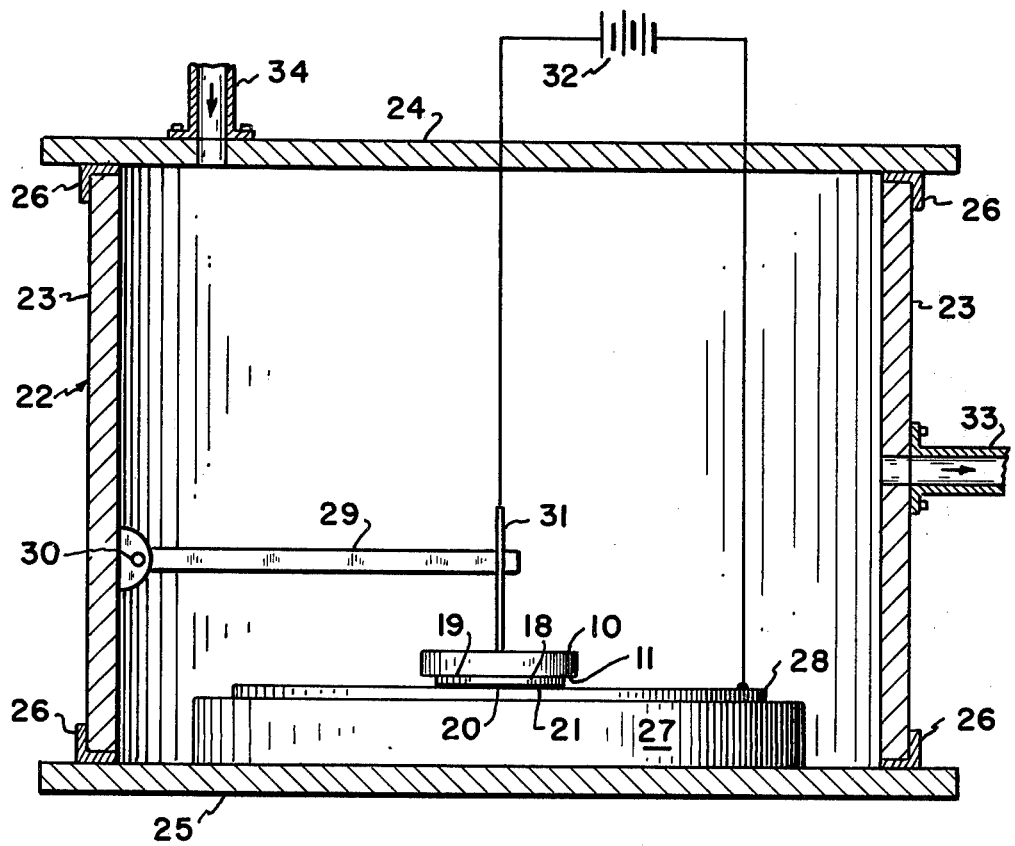
FIG. 7 is a schematic view in elevation of apparatus suitable for performing the electrostatic bonding for the present invention.

Semiconductor body 10 and the pyroelectric body 18 are prepared for electrostatic bonding by placing them in apparatus shown in FIG. 7 with first major surface 11 and first major surface 19 in contact. That apparatus comprises a furnace chamber 22 preferably in which a suitable atmosphere or vacuum is established to avoid oxidation. Furnace chamber 22 is comprised of cylindrical sidewalls 23 and circular end caps 24 and 25. The sidewalls and end caps are heat conductive or heat insulating depending upon whether the heat source for the furnace is within or without the furnace chamber. Preferably, the heat source is a RF induction heater (not shown) extending cylindrically around the outside of sidewalls 23, which are of a heat conductive material such as quartz. Cylindrical sidewalls 23 are hermetically sealed to end caps 24 and 25 by standard L-shaped seals 26 to provide for ease in disassembly of furnace 22 for disposition and removal of apparatus to and from the furnace chamber.

Semiconductor body 10 and pyroelectric body 18 are laid in chamber 22 on holder 27 and planar conductive strip 28, which is preferably platinum, with first major surfaces 11 and 19 together, and with metal layer 21 in contact with conductive strip 28 over its entire surface. Manipulator arm 29 is then pivoted at 30 to bring light pressure contact 31, which is also preferably platinum, into place in contact with semiconductor body 10, preferably at the central portion of said semiconductor body. Pressure contact 31 is electrically connected to one terminal of DC power supply 32 and conductive strip 28 is electricaly connected to the other terminal of DC power supply 32.

A suitable atmosphere is then established in furnace chamber 22 preferably by exahausting through outlet port 33, which preferably communicates with a standard oil diffusion, vacuum pump (not shown). Preferably, an atmosphere is provided of a partial vacuum of typically less than $1 \times 10^{-5}$ torr and most desirably less than $1 \times 10^{-7}$ torr, or of relatively inert gases such as nitrogen or argon. Inert gas may be input to the chamber 22 through inlet port 34. Ambient air may also be used to provide the desired atmosphere, where procedures are followed as hereinafter described to avoid oxidation on major surfaces 11 and 19.

The assembly is then heated in furnace 22 typically by an RF induction heater (now shown) around sidewalls 23 of furnace 22. If the atmosphere in furnace is ambient air, the potential of at least about 300 volts and typically about 500 volts is applied across semiconductor body 10 and pyroelectric body 18 between conductive strip 28 and pressure contact 31 before heating to avoid oxidation. Where a relatively inert atmosphere is used, the nature of the atmosphere itself is sufficient to avoid oxidation of semiconductor 10 and pyroelectric body 18. The assembly is heated to at least 150° C. and generally preferably about 450° C. The precise temperature wil depend upon the composition of the semiconductor and pyroelectric bodies. For example, 400° to 600° C. is sufficient if the pyroelectric body is lithium niobate ($LiNbO_3$) and the semiconductor body is silicon (Si). For lithium tantalate ($LiTaO_3$) or SBN ($Sr_{1-x}Ba_xNb_2O_6$) pyroelectric bodies and silicon (Si) or germanium (Ge) semiconductor bodies, the furnace is heated to a minimum of 300° C. and most desirably 400° to 600° C. Similarly, for TAS ($Tl_3AsSe_3$) and pyrargyrite ($Ag_3SbS_3$) the furnace is heated to a maximum of 200° C. and most desirably about 150° C. The temperature must be below the softening or melting point of both the pyroelectric and semiconductor compositions. For this reason the temperature is generally not above 900° C., depending upon the pyroelectric and semiconductor materials.

An electrical potential of at least 700 volts and typically 1,500 to 2,000 volts is then applied across pyroelectric body 18 and semiconductor body 10 between conductor strips 28 and pressure contact 31. The electrical potential will vary with the composition of the pyroelectric and semiconductor bodies, their thickness, and the temperature to which the assembly is heated. The voltage must be sufficient at the particular temperature to cause a small current of at least 0.1 to 20 milliamperes/m$^2$ and preferably 1 to 10 milliamperes/m$^2$ to pass through the pyroelectric and semiconductor bodies between the conductive strip 28 and pressure contact 31.

When the assembly is heated and the electric potential applied across the pyroelectric and semiconductor bodies, an electrostatic bond layer is progressively formed at the interface between pyroelectric body 18 and semiconductor body 10. It is believed that as the current flows through relatively small spaced apart localized areas of the first major surfaces of the pyroelectric and semiconductor bodies, which are in physical contact, adjacent surface areas become depleted of charge, and electrostatic attraction occurs between adjacent portions of major surfaces 11 and 19 semiconductor body 10 and pyroelectric body 18. The adjacent portions of the first major surfaces are thus drawn together forming the electrostatic bond layer of increased resistivity. The current flow is in turn diverted to adjacent areas of lower resistivity, and the electrostatic bond layer is progressively formed. The electrostatic bonding continues uniformly throughout the interface by reason of the presence of metal layer 21, which distributes the electrostatic field substantially uniformly over the pyroelectric body. Because of the minute thickness of the electrostatic bond layer, it has not been possible to determine with certainty its chemical or physical composition.

The time required to form the electrostatic bond layer will vary primarily with the current flow through the interface, with the higher current flow associated with the shorter electrostatic bonding time. The time, however, varies with the pyroelectric and semiconductor materials being bonded, the thicknesses of those materials, and the temperature to which the materials are heated. Generally the electrostatic bond layer will be fully formed in a time period of about 30 seconds to 30 minutes, irrespective of the parameters, unless a very low potential or temperature is utilized. Under these latter conditions, the formation of the electrostatic bond layer may require several hours.

After formation of the electrostatic bond layer, the assembly is cooled to room temperature at a low rate to avoid cracking of semiconductor and pyroelectric bodies 10 and 18 as well as the electrostatic bond between them. The precise cooling temperature depends primarily upon the difference in the coefficient of thermal expansion of the pyroelectric and semiconductor materials, and the thicknesses of the semiconductor and pyroelectric bodies. For lithium niobate ($LiNbO_3$) and silicon (Si) of less than 100 microns in thickness, the cooling rate is less than 5° C. per minute and is typically about 1° to 2° C. per minute.

After cooling, the electrostatically bonded pyroelectric-on-semiconductor assembly is removed from furnace 22. The pyroelectric body 18 is then preferably thinned to a substantially uniform thickness of about 1 to 5 microns by removing portions of the pyroelectric body adjacent second major surface 20. The removal of said portions of the pyroelectric body may be accomplished by any of the available techniques such as chemical etching, anodic dissolution or ion beam milling. Before, during or after the thinning operation, metal layer 21 is preferably removed from second major surface 20 of pyroelectric body 18 so that further fabrication steps can proceed.

First and second electrodes 37 and 38 and gate electrode 39 are then simultaneously formed. First and second electrodes 37 and 38 are spaced apart from each other and ohmically contact with first major surface 11 at first and second impurity regions 13 and 14, respectively. Gate electrode 39 is positioned in intimate contact on second major surface 20 of pyroelectric body 18 at least between said first and second electrodes 37 and 38.

Said electrodes are formed by first growing or depositing a masking layer 40 over the exposed portions of the first major surface 11 and second major surface 20. The masking layer 40 is then selectively removed from second major surface 20 and adjacent areas 41 and 42 to expose portions of first major surface 11 at impurity regions 13 and 14. The electrodes are then formed by vapor or sputter deposition of a suitable metal over the entire surface, and thereafter selectively removing the unwanted metal of masking layer 40 typically by standard photolithographic and etching techniques.

The metal used for the electrodes is selected for the particular semiconductor material to provide a low resistance, ohmic contact with semiconductor body 10 at first and second impurity regions 13 and 14. For example, it is preferred to use gold or aluminum where the semiconductor body 10 is silicon. Other suitable metals are nickel, silver, tin, indium, palladium, titanium, copper and platinum, and base metals thereof. The thickness to which the electrodes are deposited is dependent upon the desired current density of the detector. The thickness of the electrodes will generally range from a low of about 30 Angstroms to over 10,000 Angstroms, with between 1,500 and 5,000 Angstroms being generally used.

After formation of electrodes 37, 38 and 39, gate electrode 39 has its exposed surfaces blackened typically by deposition of channel black to provide the gate electrode with the capability of absorbing radiation to be detected.

Poling electrode 43 is also positioned in ohmic contact with second major surface 12 of semiconductor body 10. Electrode 43 is of any suitable metal, such as antimony doped gold or silicon, which makes good ohmic contact to the semiconductor body 10. Poling electrode 43 is typically separately formed in a circular shape at least as large as semiconductor body 10. Electrode 43 is alloyed to second major surface 12 by heating electrode 43 in contact with second major surface 12, semiconductor body 10 in an inert atmosphere to a temperature typically of about 420° C. In this way, electrode 43 makes ohmic contact with semiconductor body 10 across the entire major surface 12.

The detector is poled by electrically connecting poling circuit 44 to first electrode 37, gate electrode 39 and poling electrode 43 via leads 45, 46 and 47, respectively. First and second electrodes 37 and 38 are also electrically connected to measuring circuit 48 via leads 49 and 50, respectively.

For operation, the pyroelectric electromagnetic radiation detector is first poled by application of a given external voltage from poling circuit 44 to gate electrode 39 and poling electrode 43. The voltage is also applied between gate electrode 39 and first electrode 43 to aid in polarization. The pyroelectric body 18 is thus polarized as shown by arrows 51, causing a depletion or accumulation of carriers in conductive channel 17 at first major surface 11 as shown by 52.

Electromagnetic radiation beam 53 to be measured is then incident or blackened gate electrode 39 where the radiation is absorbed, causing a change in the polarization of the pyroelectric body 18 and in turn the conductivity of conductive channel 17 between impurity regions 13 and 14. The change in conductivity of conductive channel 17 is in turn measured as a change in current in measuring circuit 48. The electromagnetic radiation 53 is thus detected and measured.

Figure 3:
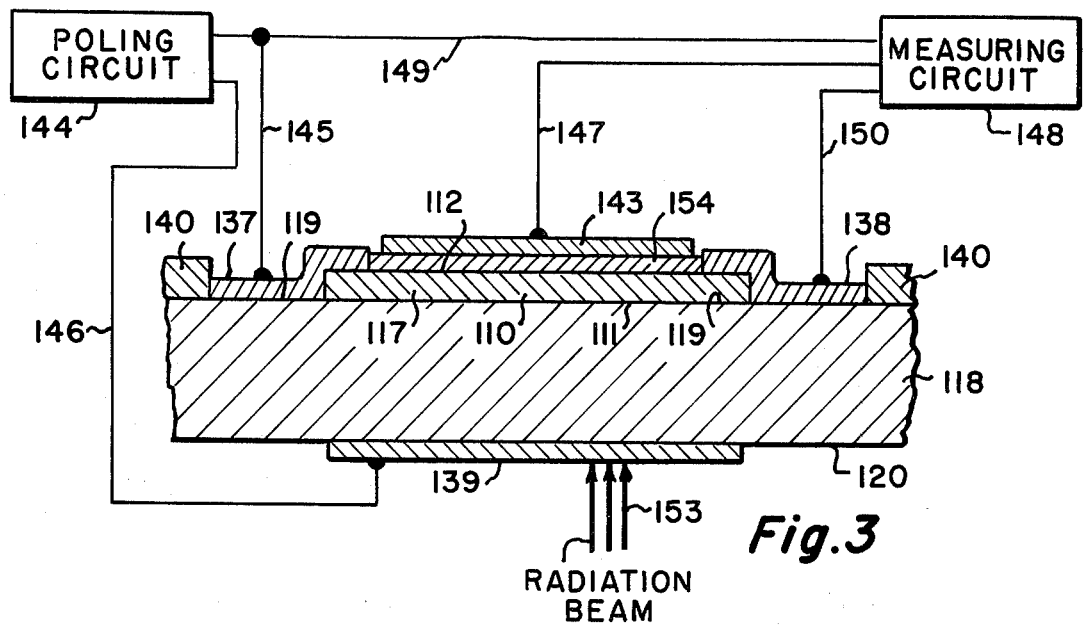
FIG. 3 is an elevational view in cross-section of a second pyroelectric-field effect electromagnetic radiation detector, with the supporting circuits shown schematically.

Referring to FIG. 3, a second pyroelectric-field effect electromagnetic radiation detector of the present invention is shown. The detector is made and used essentially as above described in connection with FIG. 2, and accordingly, the parts and elements are correspondingly numbered with the prefix 1 in front of each number.

The pyroelectric-field effect electromagnetic radiation detector of FIG. 3 varies from the one described in FIG. 2 in the following respects: (i) Pyroelectric body 118 is the supporting element of the structure, having a thickness typically between 100 and 500 microns. (ii) Conductive channel 117 is defined by the spacing between first and second electrodes 137 and 138 and the thickness of semiconductor body 110 so that impurity regions corresponding to regions 13 and 14 are not needed. (iii) Poling electrode 143 is spaced from semiconductor body 110 by insulator layer 154, such as aluminum oxide ($Al_2O_3$), silicon monoxide (SiO) or silicon dioxide ($SiO_2$9, to provide an additional MOS gate for modulation of channel 117 during operation. Indeed, in this embodiment, it is preferred that only first electrode 145 be used for poling and that poling electrode 143 be used singly as a second gate electrode, as shown, with lead 147 extending only to measuring current 148.

In this embodiment semiconductor body 110 is preferably formed by a sputter or vapor deposition technique similar to that utilized in making thin-filmed transistors. Semiconductor body 110 may be a single crystal, polycrystalline or amorphous layer and may consist of either an N or P type semiconductor material. The semiconductor body typically has a resistivity between 1 and 100 ohm-cm. Suitable semiconductor materials for semiconductor body 110 include: tellurium (P-type), lead telluride (P or N-type), cadmium sulfide (N-type), cadmium selenide (N-type), indium arsenide (N-type), gallium arsenide (N-type), tin dioxide (N-type), silicon (N or P-type), lead sulfide (P-type), zinc telluride (N-type), zinc sulfide (N-type), zinc selenide (N-type), zinc sulfide selenide [$ZnS_xSe_{1-x}$](N-type), gallium sulfide (N or P-type), indium phosphide (N or P-type), aluminum antimonide (N-type), cadmium telluride (P-type), zinc oxide (N-type), gallium nitride (N or P-type) and cadmium difluoride.

The thickness of semiconductor body 110 will vary primarily with the leakage current which can be tolerated in the conductive channel 117. The thickness will thus vary with the semiconductor material used and the doping concentration of semiconductor material, as well as the power capacity desired for the detector. For example, for tellurium, the thickness will typically vary from about 40 Angstroms to about 130 Angstroms. For even higher resistivity materials such as cadmium sulfide, the thickness will typically be higher, and even as high as 2,000 Angstroms.

Figure 4:
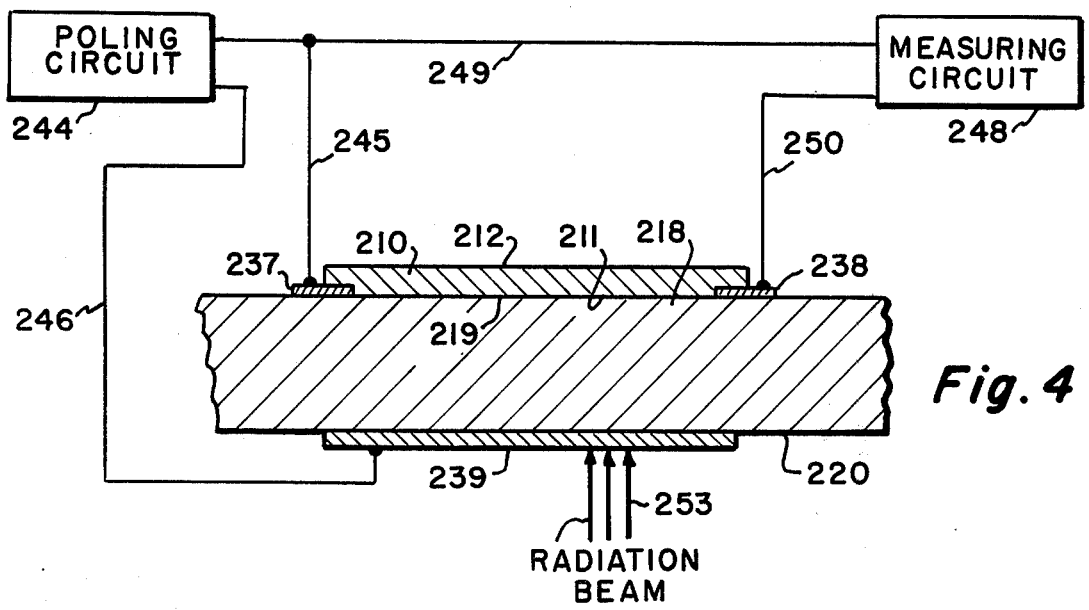
FIG. 4 is an elevational view in cross-section of a third pyroelectric-field effect electromagnetic radiation detector, with supporting circuits shown schematically.

Referring to FIG. 4, a third pyroelectric-field effect electromagnetic radiation detector of the present invention is shown. The structure and operation is essentially the same as the pyroelectric-field effect radiation detector described in connection with FIG. 3, except that no independent poling electrode is used. Accordingly, the parts and elements are correspondingly numbered to the parts and elements of the above-described pyroelectric-field effect electromagnetic radiation detectors with the prefix 2 in front of each number.

In the electromagnetic-field effect radiation detector shown in FIG. 4, poling of the pyroelectric body 218 is accomplished by applying an electric field between first electrode 237 and gate electrode 239. Alternatively, poling of the pyeoelectric body 218 can be accomplished by applying an electric field between second electrode 238 and gate electrode 239, or by applying an electric field between both first and second electrodes 237 and 238 and gate electrode 239. The poling and measuring circuits 244 and 248 would be correspondingly altered, with the appropriate blocking circuits, to accommodate these alternative poling arrangements. Also, first and second electrodes 237 and 238 are formed on major surface 211 prior to positioning of semiconductor body 210 on pyroelectric body 218, and the semiconductor body 210 is extended to overlap the electrodes 237 and 238 so that the electrodes 237 and 238 make intimate contact with the end portions of semiconductor body 210 as well as major surface 219 of pyroelectric body 218. Alternatively, first and second electrodes 237 and 238 can be formed after semiconductor body 210 is electrostatically bonded to pyroelectric 218 so that said electrodes contact the ends and major surface 220 similar to the first and second electrodes shown in FIG. 3.

This pyroelectric-field effect electromagnetic radiation detector further simplifies the fabrication steps in the manufacture of the detector.

Figure 5:
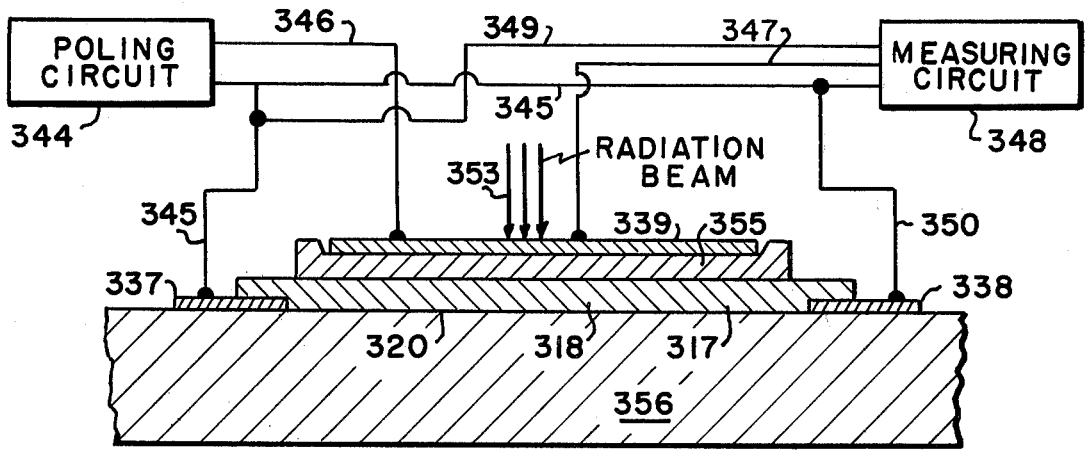
FIG. 5 is an elevational view in cross-section of a fourth pyroelectric-field effect electromagnetic radiation detector, with supporting circuits shown schematically.

Referring to FIG. 5, a fourth pyroelectric-field effect electromagnetic radiation detector of the present invention is shown. In this detector, the semiconductor body is eliminated by providing a body 318 having both pyroelectric and semiconductor properties. Materials suitable for body 318 having both pyroelectric and semiconductor properties are TAS ($Tl_3AsSe_3$), proustite ($Ag_3AsS_3$) and pyoustite ($Ag_3AsS_3$). Materials additionally contemplated that may be suitable are cadmium sulfide (CdS), zinc sulfide (ZnS), indium sulfide (InAs), germanium sulfide (GeAs), indium phosphide (InP) and the like.

The detector is made by depositing first and second electrodes 337 and 338 spaced apart from each other on a major surface of an insulator substrate of, for example, quartz, spinel or sapphire. The pyroelectric-semiconductor body 318 is separately formed as above described typically with a thickness between 50 and 250 microns, and bonded preferably by the electrostatic technique above described to the substrate between and overlapping first and second electrodes 337 and 338 so that electrodes 337 and 338 make good, intimate contact with body 318 to form conductive channel 317 in body 318 between the electrodes. Body 318 is then typically thickened to a substantially uniform thickness of between about 5 and 10 microns, again depending on the composition and resistivity of the body. Gate electrode 339 is positioned between first and second electrodes 337 and 338, but spaced from second major surface of body 318 by insulator layer 335. Insulator layer 355 is of a material with good heat conduction properties, such as silicon dioxide ($SiO_2$) or aluminum oxide ($Al_2O_3$), and has a thickness typically between 1000 and 2000 Angstroms to enable the pyroelectric to be highly responsive to the radiation absorbed at the gate electrode.

This pyroelectric-field effect electromagnetic radiation detector still further simplifies the fabrication steps in the manufacture of the detector.

Figure 6:
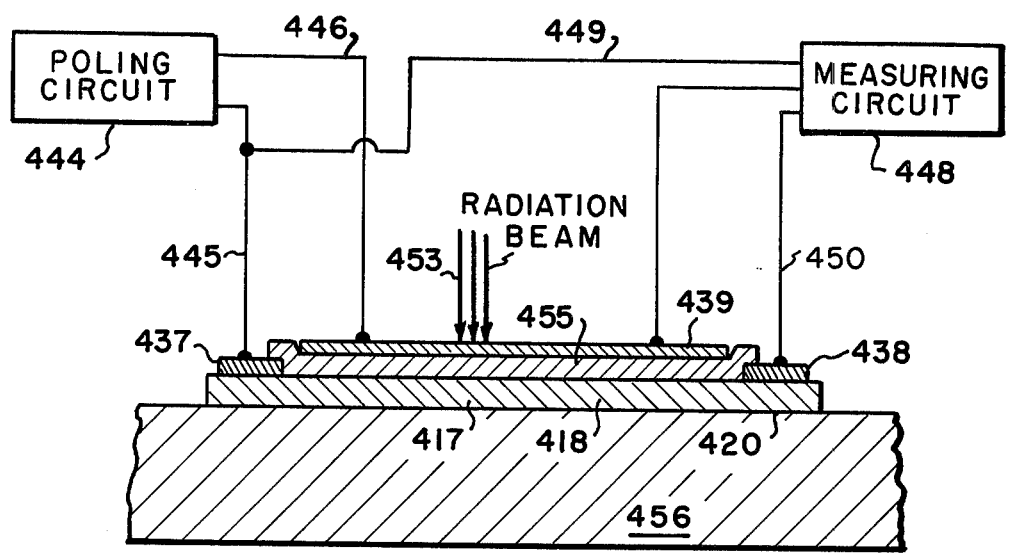
FIG. 6 is an elevational view in cross-section of a fifth pyroelectric-field effect electromagnetic radiation detector, with supporting circuits shown schematically.

Referring to FIG. 6, a fifth pyroelectric-field effect electromagnetic radiation detector of the present invention is shown. This detector is identical to the detector shown in FIG. 5 except that the first and second electrodes 437 and 438 are positioned in intimate contact on the opposite side of the body 418 having both pyroelectric and semiconductor properties. This detector is specifically shown because it may not be readily apparent that poling of the pyroelectric can be accomplished with this embodiment where the poling electrode, in this case first electrode 437, is positioned on the same side of the pyroelectric as the gate electrode 439.

While the preferred embodiments of the invention have been shown and described with particularity it is distinctly understood that the invention may be otherwise variously embodied and utilized within the scope of the following claims.

What is claimed is:
1. A pyroelectric-field effect electromagnetic radiation detector comprising:
   A. a semiconductor body of a given conductivity type having opposed major surfaces;
   B. first and second electrodes spaced apart from each other in ohmic contact with the semiconductor body to form a conductive channel in said body between said electrodes;
   C. a pyroelectric body having opposed major surfaces substantially normal to a polar axis thereof and having one said major surface in intimate contact with a major surface of the semiconductor body at least between said first and second electrodes and polarized therethrough substantially normal to said opposed major surfaces at least between said first and second electrodes; and
   D. a gate electrode capable of absorbing radiation to be detected positioned adjacent a major surface of said pyroelectric body at least between said first and second electrodes.

2. A pyroelectric-field effect electromagnetic radiation detector as set forth in claim 1 comprising in addition.
   E. a poling electrode adapted to polarize said pyroelectric body at least between said first and second electrodes and effect the conductivity of said conductive channel by application of a given external voltage between said gate electrode and said poling electrode.

3. A pyroelectric-field effect electromagnetic radiation detector as set forth in claim 2 wherein:
   at least said first and second electrode is additionally in intimate contact with said pyroelectric body; and
   said poling electrode is at least said first or second electrode.

4. A pyroelectric-field effect electromagnetic radiation detector as set forth in claim 1 wherein first and second impurity regions of opposite type conductivity are spaced apart in said semiconductor body adjoining said first and second electrodes, respectively, and adjoining the major surface thereof contacting said pyroelectric body to define said conductive channel in said body between said first and second electrodes.

5. A pyroelectric-field effect electromagnetic radiation detector comprising:
   A. a body having both pyroelectric and semiconductor properties and having good opposed major surfaces substantially normal to a polar axis thereof;
   B. first and second electrodes spaced apart from each other in ohmic contact with the semiconductor body to form a conductive channel in said body between said electrodes;
   C. said body polarized therethrough substantially normal to said opposed major surfaces at least between said first and second electrodes; and
   D. a gate electrode capable of absorbing radiation to be detected positioned adjacent a major surface of said body between said first and second electrodes.

6. A pyroelectric-field effect electromagnetic radiation detector as set forth in claim 5 comprising in addition:
   E. a poling electrode adapted to polarize said body at least between said first and second electrodes and effect the conductivity of said conductive channel by application of a given external voltage between said gate electrode and said poling electrode.

7. A pyroelectric-field effect electromagnetic radiation detector as set forth in claim 6 wherein:
   said poling electrode is at least said first or second electrode.

8. A pyroelectric-field effect electromagnetic radiation detector as set forth in claim 5 comprising in addition:
   an electrical insulator layer intermediate and an intimate contact with said body ad said gate electrode.

9. A pyroelectric-field effect electromagnetic radiation detector comprising:
   A. a semiconductor body of a given conductivity type having opposed major surfaces with at least one said major surface in planar configuration;
   B. first and second electrodes spaced apart from each other in ohmic contact with the semiconductor body to form a conductive channel in said body between said electrodes;
   C. a pyroelectric body having opposed major surfaces substantially normal to a polar axis thereof with at least one said major surface in planar configuration, said planar major surface thereof being electrostatically bonded to said planar major surface of the semiconductor body at least between said first and second electrodes, and said body polarized therethrough substantially normal to said opposed major surfaces at least between said first and second electrodes; and
   D. a gate electrode capable of absorbing radiation to be detected positioned adjacent a major surface of said pyroelectric body at least between said first and second electrodes.

10. A pyroelectric-field effect electromagnetic radiation detector as set forth in claim 9 comprising in addition:
    E. a poling electrode adapted to polarize said pyroelectric body at least between said first and second electrodes and effect the conductivity of said conductive channel by application of a given external voltage between said gate electrode and said poling electrode.

11. A pyroelectric-field effect electromagnetic radiation detector as set forth in claim 10 wherein:
    at least said first or second electrode is additionally in intimate contact with said pyroelectric body; and
    said poling electrode is at least said first or second electrode.

12. A pyroelectric-field effect electromagnetic radiation detector as set forth in claim 9 wherein:
    first and second impurity regions of opposite type conductivity are spaced apart in said semiconductor body adjoining said first and second electrodes, respectively, and adjoining the major surface thereof contacting said pyroelectric body to define said conductive channel in said body between said first and second electrodes.

* * * * *